United States Patent [19]
David et al.

[11] Patent Number: 4,973,967
[45] Date of Patent: Nov. 27, 1990

[54] RADIOALTIMETER TYPE OF DETECTOR AND A PROXIMITY FUSE EQUIPPED WITH SUCH A DETECTOR

[75] Inventors: Jacques David, Montastruc; Raymond Crampagne, Toulouse; Jean Baricos, Ramonville Saint Agne, all of France

[73] Assignee: Etienne Lacroix - Tous Artifices S.A., Muret, France

[21] Appl. No.: 276,250

[22] Filed: Nov. 23, 1988

[30] Foreign Application Priority Data

Nov. 27, 1987 [FR] France .................. 87 16492

[51] Int. Cl.⁵ .................. G01S 13/34; F42C 13/04
[52] U.S. Cl. .................. 342/122; 342/68; 342/200
[58] Field of Search .................. 342/68, 122, 128, 200; 365/84–87

[56] References Cited

U.S. PATENT DOCUMENTS

| | | | |
|---|---|---|---|
| 3,798,590 | 3/1974 | Jacobson et al. | 367/90 |
| 3,802,343 | 4/1974 | Dahl | 342/68 X |
| 3,874,296 | 4/1975 | Hedemark | 342/68 X |
| 3,938,147 | 2/1976 | Kalmus | 342/68 |
| 4,040,357 | 8/1977 | Saunders | 342/68 X |
| 4,059,052 | 11/1977 | Karr | 342/68 X |
| 4,319,244 | 3/1982 | Hirota et al. | 342/128 |
| 4,427,981 | 1/1984 | Kyriakos | 342/122 |
| 4,449,209 | 5/1984 | Zehner et al. | 367/102 |
| 4,620,192 | 10/1986 | Collins | 342/128 |
| 4,672,379 | 6/1987 | Bishop | 342/28 |

FOREIGN PATENT DOCUMENTS

| | | |
|---|---|---|
| 0028895 | 5/1981 | European Pat. Off. . |
| 0066168 | 12/1982 | European Pat. Off. . |
| 2513831 | 4/1983 | France . |

OTHER PUBLICATIONS

Rabinowitz, et al "Applications of Digital Technology to Radar", Proc. IEEE, vol. 73, No. 2, Feb. 1985, pp. 325-339.

Primary Examiner—Gilberto Barrón, Jr.
Attorney, Agent, or Firm—Blakely, Sokoloff, Taylor & Zafman

[57] ABSTRACT

The invention relates to a radioaltimeter type detector comprising an oscillator-transmitter (10), a modulator (20) suitable for frequency modulating the oscillator-transmitter according to a given characteristic, a mixer receiving the signal from the oscillator-transmitter and a corresponding echo signal reflected by a target, and a discriminator circuit (50, 60) connected to the output from the mixer. According to the invention, the modulator (20) includes a digital memory (21) containing a series of values defining the frequency modulation characteristic of the oscillator-transmitter (10).

15 Claims, 4 Drawing Sheets

Prior art
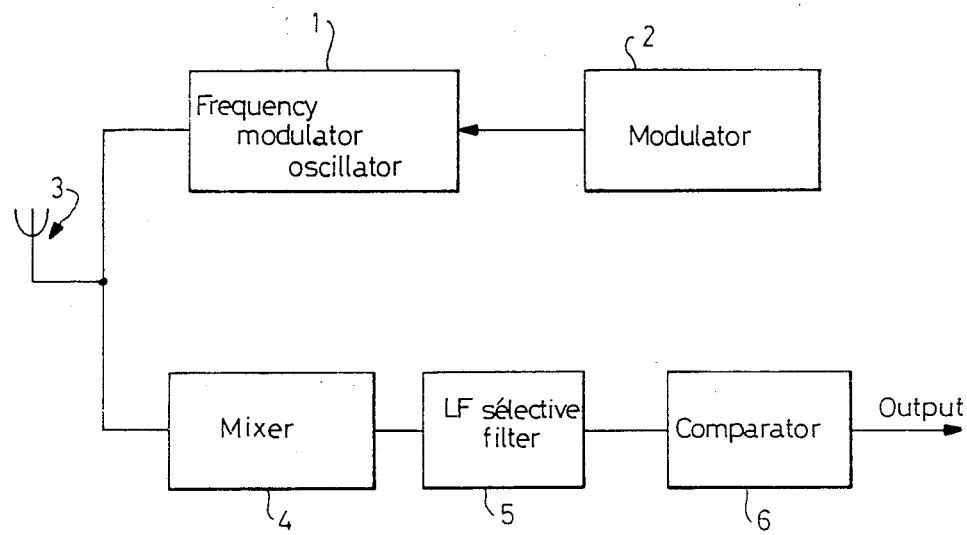
FIG_1
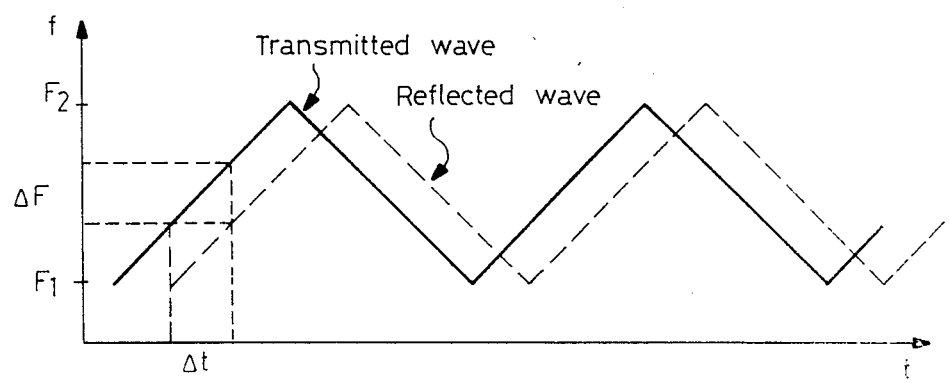
FIG_2

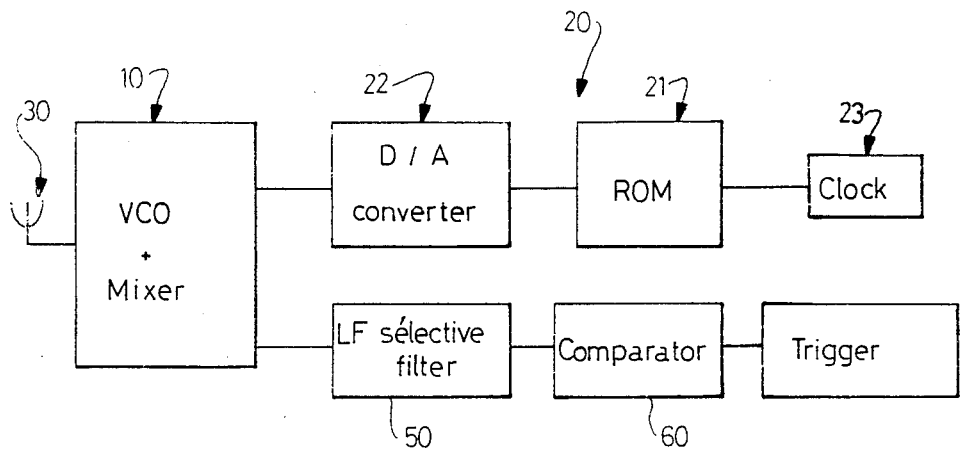
FIG_3
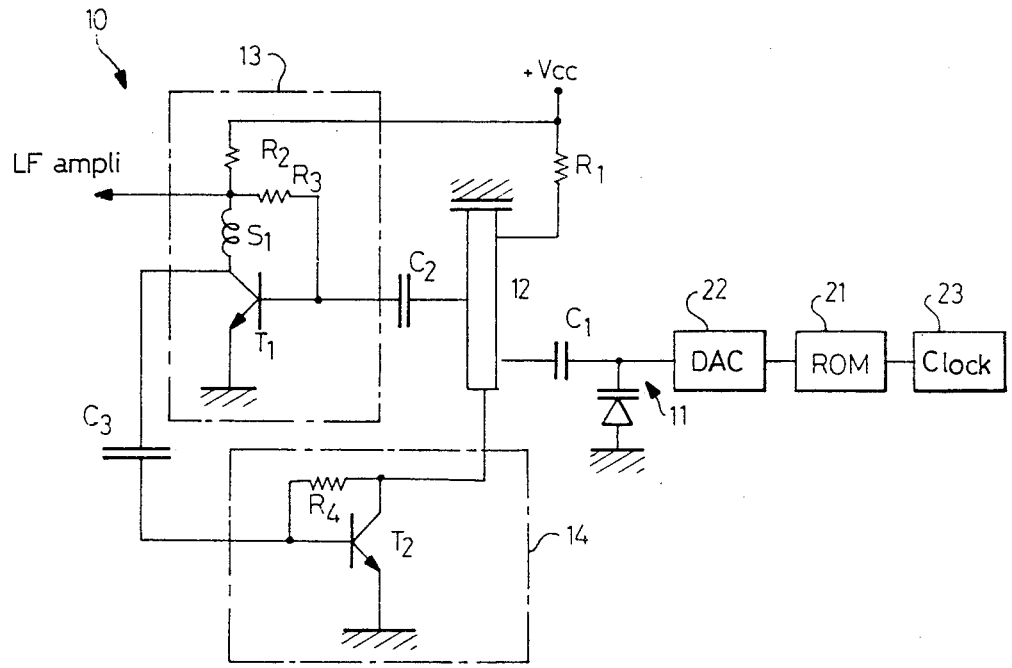
FIG_4

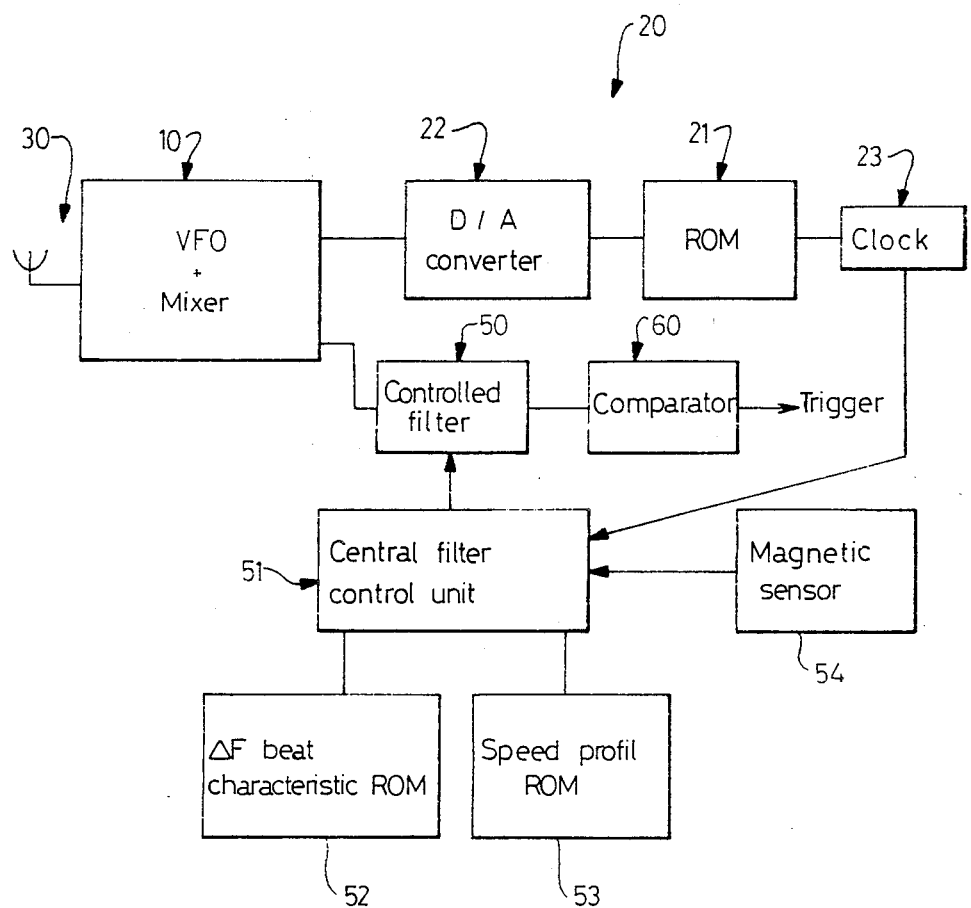
FIG_5

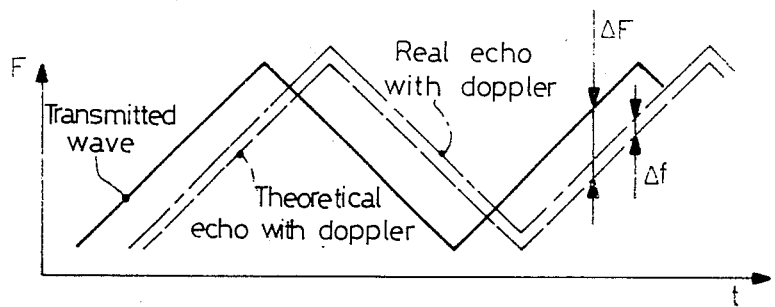
FIG_6A
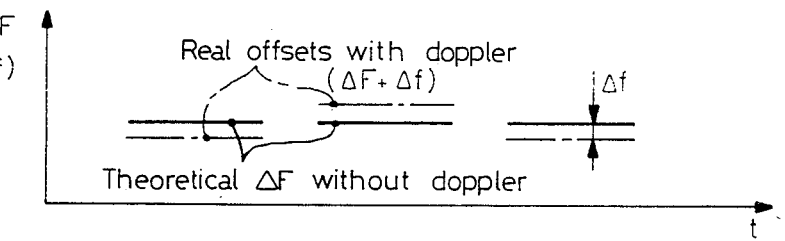
FIG_6B
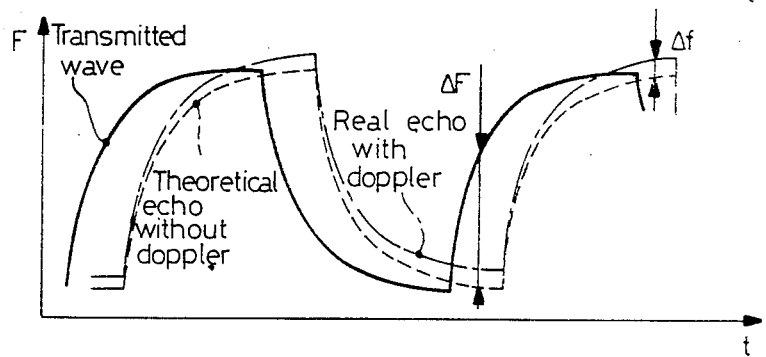
FIG_7A
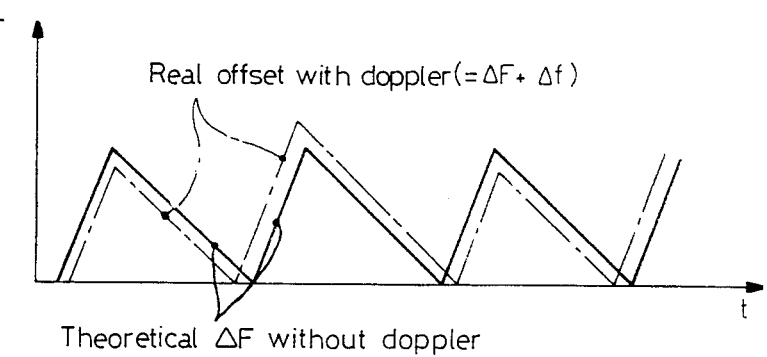
FIG_7B

RADIOALTIMETER TYPE OF DETECTOR AND A PROXIMITY FUSE EQUIPPED WITH SUCH A DETECTOR

The present invention relates to proximity detectors. It is particularly applicable in the design of proximity fuses for munitions.

BACKGROUND OF THE INVENTION

Various different proximity detection techniques are usable, in theory, in the design of proximity fuses. Mention may be made of the following techniques: using the Doppler effect; using a radioaltimeter with a frequency modulated oscillator; using pulse radar; using ultrasound; using optoelectronic detection; ... .

Proximity fuses are generally constructed using a technique based on the Doppler effect. The use of this effect makes it possible to obtain a detection assembly which is relatively simple. However, use of the Doppler effect gives rise to a wide dispersion in trigger distances. This dispersion results from the fact that proximity detection using the Doppler effect relies on power amplitude discrimination in the return signal. Unfortunately, this power is related to the reflection coefficient of the obstacle under consideration and this varies very widely as a function of the nature of the obstacle. In addition, Doppler effect detection cannot be used with slow projectiles insofar as the resulting Doppler effect is unusable. In conclusion, although Doppler effect detectors are theoretically advantageous because of their simplicity, they do not give complete satisfaction because of the wide margin of uncertainty in trigger distance and because they cannot be used with slow projectiles.

Attempts have been made to remedy these drawbacks by developing radioaltimeter type detectors for proximity fuses.

The structure of one such prior art radioaltimeter type detector is shown in accompanying FIG. 1.

It can be seen in said accompanying FIG. 1 that an oscillator 1 is frequency modulated by a modulator 2. The frequency modulated oscillator 1 is coupled to an antenna 3. Thus, a frequency modulated wave is radiated towards the target. A fraction of the signal coming from the oscillator-transmitter 1 is directed to a mixer 4. The mixer also receives the echo reflected by the target. Assuming that the system fitted with the radioaltimeter is fixed relative to the target, then the echo corresponds to the transmitted wave with a delay due to the round trip time between the antenna 3 and the target. This causes the output from the mixer 4 to provide a beat frequency $\Delta F$ which depends directly on the round trip time of the wave, and thus on the distance between the detector and the target. The signal obtained at the output from the mixer is applied to a discriminator circuit. The discriminator circuit may advantageously be constituted by a low frequency selector filter 5 and by a comparator 6.

By way of example, FIG. 2 has a solid line showing linear modulation of the frequency of the oscillator-transmitter 1 in the form of symmetrical sawteeth. FIG. 2 also shows a dashed line representing the received echo as directed to the mixer 4. The person skilled in the art will readily understand that a round trip time $\Delta t$ corresponding to the distance d between the detector and the target gives rise to a corresponding frequency difference $\Delta F$. Thus, with linear frequency modulation of the oscillator-transmitter 1, measuring the distance d is equivalent to detecting the corresponding beat frequency $\Delta F$ at the output from the mixer 4. This can be done by tuning a selective filter 5 to beats at the desired frequency $\Delta F$.

Using a radioaltimeter type detector gives rise to very much higher triggering accuracy than can be obtained with detectors that use the Doppler effect. Radioaltimeter type detectors are completely insensitive to the reflection coefficient of the target since they discriminate on the basis of a beat frequency and not on the basis of power amplitude.

The trigger distance d at which a radioaltimeter type detector responds can easily be adjusted merely by altering the slope of the low frequency signal used to frequency modulate the oscillator-transmitter.

In addition, radioaltimeter type detectors can be fitted to slow projectiles. The looked-for beat frequency $\Delta F$ at the output from the mixer 4 is essentially related to the round trip time of the signal generated by the oscillator-transmitter 1, and depends, in contrast, very little on the speed of the projectile to which it is fitted. (The influence of the Doppler effect on measurements is specified below.)

In spite of all these theoretical advantages presented by radioaltimeter type detectors, it is observed, in practice, that radioaltimeter type detectors are used very little at present for making proximity fuses, whereas detectors using the Doppler effect nevertheless remain the most widely used.

This preference for Doppler effect detectors over radioaltimeter type detectors appears to be due to the fact that implementations of radioaltimeter type detectors have hitherto been bulky and very expensive since it has been necessary to select the various components of the circuit with great care, in particular the components of the oscillator-transmitter 1, in order to ensure that the modulation characteristics correspond exactly with the intended characteristics.

The object of the present invention is to provide a new radioaltimeter type detector which provides good triggering accuracy while being considerably cheaper than earlier detectors of this type.

SUMMARY OF THE INVENTION

This object is achieved, in the context of the present invention, by a radioaltimeter type detector comprising:
an oscillator-transmitter;
a modulator suitable for imparting frequency modulation of given characteristic to the oscillator-transmitter;
a mixer receiving the signal from the oscillator-transmitter and a corresponding echo signal reflected by a target; and
a discriminator circuit connected to the output from the mixer and including a filter tuned substantially to the beat frequency $\Delta F$ related to the looked-for round trip time for the signal from the oscillator-transmitter after reflection at the target;
wherein the modulator includes a digital memory containing a series of values defining the frequency modulation characteristic for the oscillator-transmitter.

By using a digital memory as the basis of the modulator, it is possible to use a conventional oscillator-transmitter which is built from components which are not specially selected and to adapt the modulation characteristics specifically to the oscillator used. In other words, by using a digital memory it is possible to reduce the bulk and the cost of the detector since rigorous component selection is not required for making the oscillator-transmitter or the module defining the modulation characteristics.

BRIEF DESCRIPTION OF THE DRAWINGS

Embodiments of the invention are described by way of example with reference to the accompanying drawings, in which:

FIGS. 1 and 2 are described above and described the prior art;

FIG. 3 is a block diagram of a radioaltimeter type detector in accordance with the present invention;

FIG. 4 shows one example of an oscillator-transmitter and mixer module in accordance with the present invention;

FIG. 5 is a block diagram of an improved embodiment in accordance with the present invention;

FIGS. 6A and 6B illustrate linear frequency modulation of the oscillator and the corresponding beat frequency $\Delta F$; and FIGS. 7A and 7B illustrate parabolic frequency modulation of the oscillator and the corresponding beat frequency $\Delta F$.

MORE DETAILED DESCRIPTION

FIG. 3 shows a module 10 coupled to an antenna 30 and serving both as a voltage controlled oscillator and as a mixer, in a manner comparable to the modules 1 and 4 shown in FIG. 1 and described above.

The output from the module stage 10 is applied to a low frequency selective filter 50 which is in turn connected to the input of a comparator 60 in a manner similar to the modules 5 and 6 shown in FIG. 1 and described above.

As mentioned before, the modulator 20 of the present invention includes a digital memory 21. This memory is connected to the control input of the voltage controlled oscillator 10 by means of a digital-to-analog converter 22. The memory 21 is controlled by a clock 23. The digital memory 21 is preferably a read only memory (ROM).

The digital memory 21 contains a series of values which are applied cyclically under control of the clock 23 to the digital-to-analog converter 22 and thence to the oscillator 10 in order to define the frequency modulation characteristic thereof. The values contained in the digital memory 21 take account of the precise characteristics of the oscillator 10 in spite of the fact that the components used in the construction of the oscillator are not specially matched.

The structure of the oscillator-transmitter and mixer module 10 shown in FIG. 4 is now described. Essentially, this module 10 comprises a varactor 11 (i.e. variable capacity diode), a quarter-wave resonator 12, a stage 13 serving as a low frequency amplifier, a UHF amplifier, and a mixer, and a stage 14 serving as a UHF amplifier.

The varactor 11 is controlled by the output from the digital-to-analog converter 22. The varactor 11 is connected to the quarter-wave resonator 12 by means of a coupling capacitor C1. The quarter-wave resonator is connected to the positive feed terminal Vcc via a bias resistor R1. The amplifier stage 13 serving as a low frequency amplifier, as a UHF amplifier, and as a mixer comprises an NPN type transistor type T1, two resistors R2 and R3, and a choke S1. The transistor T1 is connected in a common emitter circuit. Its base is connected to the quarter-wave resonator 12 by means of a coupling capacitor C2. The resistors R2 and R3 are connected in series between the terminal +Vcc and the base of the transistor T1. The choke S1 is connected between the collector of the transistor T1 and the common point between the resistors R2 and R3. The choke S1 serves to isolate the UHF signal from the low frequency beat frequency $\Delta F$ which corresponds to the instantaneous frequency difference between the UHF wave generated by the oscillator and the received echo. The beat frequency $\Delta F$ is thus taken from the point common to the two resistors R2 and R3 and the choke S1, and is applied to the low frequency selective filter 50, via an interposed low frequency amplifier, where necessary.

The collector of the transistor T1 is also fed back to the quarter-wave resonator 12 via the UHF amplifier stage 14. This stage comprises an NPN type transistor T2 connected as a common emitter with a resistor R4. The collector of the transistor T1 is connected to the base of the transistor T2 via a coupling capacitor C3. The resistor R4 interconnects the base and the collector of the transistor T2. The collector of the transistor T2 is connected to the quarter-wave resonator 12.

Naturally, the circuit diagram of the module 10 as shown in FIG. 4 is given purely by way of non-limiting example. It should, however, be observed that the circuit shown in FIG. 4 is compact and simple.

The quarter-wave resonator 12 may be used directly as the radiating element, or alternatively an antenna may be coupled to the resonator 12.

The frequency modulation characteristic of the oscillator 10 as stored in the digital memory may correspond to linear modulation as shown in continuous lines in FIG. 6A. In this case, the beat frequency $\Delta F$ obtained at the output from the mixer 10 remains constant for a given distance d between the detector and the target, as illustrated by continuous lines in FIG. 6B.

The linear modulation defined by the digital memory 21 may correspond to symmetrical sawtooth modulation as shown in FIG. 6A, or it may correspond to asymmetrical sawtooth modulation.

However, the modulation characteristic defined by the values contained in the digital memory 21 is not limited to linear modulation.

In conventional manner, the modulation characteristic may be sinusoidal, parabolic, or even pseudo-random in type.

FIG. 7A has a solid line showing parabolic frequency modulation of the oscillator, and FIG. 7B shows the corresponding beat frequency $\Delta F$.

These types of non-linear modulation are mentioned, for example, in U.S. Pat. No. 3 109 172 and reference may advantageously be made thereto in order to understand the principle of altimeter type detection when using non-linear frequency modulation of the oscillator-transmitter.

However, when the frequency modulation of the oscillator 10 is non-linear, the beat frequency $\Delta F$ obtained at the output from the mixer stage 10 varies over one modulation period for a given distance d between the detector and the target, given that the slope of the modulation characteristic is not constant. As a result, when the frequency modulation characteristic of the oscillator-transmitter !0 is non-linear, it is desirable to tune the cut-off frequencies of the filter 50 in corresponding manner. To do this, as shown in FIG. 5, the present invention proposes a preferred embodiment in which the filter 50 is voltage controlled and is driven by a central unit 51. This central unit 51 is also connected to a digital memory 52 (ROM) containing values which define the change in the reference beat frequency $\Delta F$ for a specified detection distance d corresponding to the modulation characteristic defined by the digital memory 21. Thus, for example, if the modulation is parabolic, the beat frequency $\Delta F$ from the mixer stage 10 due to radioaltimeter type detection will vary linearly for constant distance d as shown in FIG. 7B, so that the characteristic of the beat frequency $\Delta F$ stored as a reference in the digital memory 52 will correspond to a linear characteristic.

When the oscillator-transmitter 10 is modulated by modulation which is sinusoidal in appearance, the beat frequency from the mixer stage 10 varies sinusoidally for a given distance between the detector and the target. As a result, when using sinusoidal frequency modulation of the oscillator-transmitter, the beat frequency characteristic stored as a reference in the digital memory 52 is itself sinusoidal in appearance.

This can be generalized to the case of frequency modulation of the oscillator-transmitter 10 which is pseudo-random, with the beat frequency characteristic stored as a reference in the digital memory 52 taking account of the way in which the beat frequency $\Delta F$ from the oscillator-transmitter 10 will vary for constant distance d between the detector and the target.

The above explanation does not take account of the beat frequency $\Delta f$ related to the Doppler effect due to relative motion between the detector and the target. This beat frequency $\Delta f$ related to the Doppler effect may be ignored by frequency modulating the oscillator-transmitter with a slope such that the beat frequency $\Delta F$ due to the radioaltimeter type detection (and corresponding to the instantaneous difference between the frequency of the wave emitted by the oscillator-transmitter 10 and the frequency of the delayed wave received by the mixer after reflection at the target), is much greater than the beat frequency $\Delta f$ due to the Doppler effect.

Nevertheless, the Doppler effect beat frequency $\Delta f$ is superposed on the beat frequency $\Delta F$. In order to improve measurement accuracy, it is also possible to take account of the beat frequency $\Delta f$ due to the Doppler effect. In this case, in order to prevent the filter 50 from rejecting the frequency $\Delta f$, it is, on the contrary, advantageous to use a modulation slope for the oscillator-transmitter 10 such that the beat frequency $\Delta F$ obtained at the output from the mixer 10 and due to radioaltimeter type detection (i.e. the instantaneous difference between the frequency of the wave emitted by an oscillator-transmitter which is theoretically stationary relative to the target, and the frequency of the wave after being reflected at the target), is of the same order of magnitude as the beat frequency $\Delta f$ due to the Doppler effect.

By way of example, for a detector moving at a speed of 200 meters per second (m/s) with a transmitted wave having an average frequency of about 10 GHz, the beat frequency $\Delta f$ due to the Doppler effect is about 13 kHz. In order to allow the filter 50 to take account both of the beat frequency $\Delta F$ due to radioaltimeter type detection and of the beat frequency $\Delta f$ due to the Doppler effect, the frequency modulation slope of the oscillator-transmitter 10 may be chosen in such a manner that the beat frequency $\Delta F$ due to radioaltimeter detection is about 50 kHz to 100 kHz.

Further, insofar as the speed of the projectile changes during its trajectory, the beat frequency $\Delta f$ due to the Doppler effect also changes considerably. In this case, where the beat frequency $\Delta f$ due to the Doppler effect is not negligible relative to the beat frequency $\Delta F$ due to radioaltimeter type detection, it is advantageous, as shown in FIG. 5, to store the speed profile of the system in which the equipment is fitted in a digital memory 53 (ROM). This speed profile determines the characteristic with which the beat frequency $\Delta f$ due to the Doppler effect will vary as a function of the (mean or instantaneous) frequency of the transmitted wave.

The central unit 51 then applies a control signal to the control filter 50 which takes account both of the characteristic of the beat frequency $\Delta F$ stored in the memory 52 and the characteristic of the beat frequency $\Delta f$ due to the Doppler effect which corresponds to the instantaneous speed of the system and is deduced from the speed profile stored in the memory 53. It will be observed that the Doppler beat frequency $\Delta f$ is subtracted from the beat frequency $\Delta F$ when the frequency modulation slope of the oscillator is positive. Conversely, the Doppler beat frequency $\Delta f$ is added to the beat frequency $\Delta F$ when the frequency modulation slope of the oscillator is negative (see FIGS. 6A, 6B, 7A, and 7B).

Advantageously, a real target may be discriminated from a natural obstacle such as a bush or tree through which the system equipped with an altimeter type detector in accordance with the invention is passing by making use of a magnetic sensor 54 associated with the detector. The use of a magnetic sensor 54 is particularly advantageous when the altimeter type detector is fitted to a projectile which is designed to explode at a given distance from a metal body of large volume, e.g. a tank.

When an altimeter type detector in accordance with the invention is to be fitted to munitions fired at ground level, e.g. antitank munitions, it is necessary for the useful echo from the target direction to be of considerably greater amplitude than the interfering echo coming from the ground. It is then advantageous to use an antenna having high gain in the direction of travel. If the projectile spins while in motion, it is, in addition, desirable to use circular polarization.

The radioaltimeter type detector shown in FIG. 3 (whose oscillator 10 is assumed to be subjected to linear frequency modulation) generates an enabling signal at the output from the comparator 60 for the purpose of triggering the fuse when the following two conditions are both satisfied:

the beat frequency $\Delta F$ obtained at the output from the mixer lies in the passband of the low frequency selective filter 50 corresponding to a target at the desired distance; and the amplitude of the useful target echo as detected by the comparator 60, is sufficient.

By monitoring the amplitude of the received echo, it is possible not only to discriminate a useful echo on the travel axis from an interfering radio echo, but also to eliminate distance ambiguities, i.e. to discriminate a delay $\tau$ due to a target at the desired distance d, from delays $\tau+nT$ (where T is the modulation period) which correspond to greater distances which nevertheless give rise to the same beat frequency $\Delta F$. However, this monitoring of the echo amplitude merely has the aim of checking that the detector lies within a range of distances relative to the target which includes the desired trigger distance d and cannot be equated with fundamental amplitude detection as in a Doppler effect system where amplitude detection is not used for verifying that the amplitude of the signal lies within a given range, but for verifying that the amplitude of the signal corresponds to a specified value.

The more sophisticated altimeter detector shown in FIG. 5 generates an enabling signal from the output of the comparator 60 for the purpose of triggering the fuse when, in addition to verifying the amplitude of the received echo in the comparator 60, the beat frequency obtained at the output from the mixer 10 corresponds to the sum of the beat frequencies $\Delta f$ and $\Delta F$ as specified by the memory 52 and 53, and thus corresponds to the instantaneous passband of the filter 50 (not forgetting that the beat frequency $\Delta f$ is subtracted from or added to the beat frequency $\Delta F$ depending on whether the slope of frequency modulation is positive or negative).

Optionally, as mentioned above, the enabling signal may be generated at the output from the comparator 60 only after an associated magnetic sensor 54 has been activated. The security of the system may be further increased by equipping the detector with a time-out check ensuring that the altimeter type detector is put into operation only after a determined length of time has elapsed since the round equipped with the detector was launched. This time lapse is determined on the basis of the approximate distance between the launching system and the target, e.g. as measured by a telemeter, and on the speed of travel.

In the above explanation, it has been assumed that the enabling signal is generated at the output from the comparator 60 as soon as the frequency obtained at the output from the mixer 10 corresponds to the instantaneous passband of the selective filter 50.

In order to further improve detection, instead of detecting that a reference value is reached at a given instant, it is possible to verify that the beat frequency at the output from the mixer varies dynamically in an expected manner.

In other words, when the beat frequency $\Delta f$ due to the Doppler effect is negligible relative to the beat frequency $\Delta F$, dynamic detection would consist in verifying that the change in the beat frequency $\Delta F$ at the output from the mixer 10 corresponds to a reference change stored in the memory 52.

When the beat frequency $\Delta f$ due to the Doppler effect is not negligible relative to the beat frequency $\Delta F$, dynamic detection consists in verifying that the beat frequency at the output from the mixer 10 changes in a manner which corresponds to combining effects as defined by the reference characteristics stored in the memory 52 (for $\Delta F$) and the reference characteristic stored in the memory 53 (for $\Delta f$). It is recalled that the beat frequency $\Delta f$ is subtracted from the beat frequency $\Delta F$ for frequency modulation with positive slope, and that it is added to the beat frequency $\Delta F$ for a frequency modulation with negative slope.

Dynamic detection may be performed over one modulation period, over a portion of a modulation period, or over a plurality of modulation periods.

An altimeter type detector in accordance with the present invention is capable of being fitted to numerous systems, and in particular to numerous types of munition, e.g. aircraft bombs, rockets, missiles, sub-munitions, aircraft cartridges, shells, etc.

An altimeter type proximity detector in accordance with the invention has the advantage of being small in size, insensitive to the angle of incidence of the projectile, of triggering at known distance from the obstacle, which distance is easily adjustable and independent of the nature of the target, and of operating at any speed.

In addition, an altimeter type detector in accordance with the present invention provides good immunity to countermeasures. This immunity is due, inter alia, to the nature of the signal used, i.e. a frequency modulated signal, to the need for several specified items of information to the detected simultaneously in order to cause triggering to take place ($\Delta F$, $\Delta f$, amplitude level, and magnetic detection where applicable), and to the time lapse after launching before the detector is put into operation if the time-out security feature is provided. Finally, it may be observed that the frequency modulation characteristic of each detector is defined as a function of the specific characteristics of its oscillator-transmitter. In other words, modulation is not centered on a standard frequency. It may vary considerably and randomly between two detectors.

Naturally, the present invention is not limited to the particular embodiments described above and it extends to any variant coming within the scope of the claims.

We claim:

1. A radioaltimer type detector comprising:
   an oscillator-transmitter;
   a modulator suitable for imparting frequency modulation of given characteristic to the oscillator-transmitter, said modulator including a digital memory containing a series of values defining the frequency modulation characteristic for the oscillator-transmitter;
   a secondary digital memory containing a series of values defining a speed profile for the system equipped with the detector, and thus a characteristic for change in Doppler beat frequency $\Delta f$;
   a mixer receiving the signal from the oscillator-transmitter and a corresponding echo signal reflected by a target; and
   a discrimator circuit connected to the output from the mixer and including a filter tuned substantially to the sum of the beat frequency $\Delta F$ related to the looked-for round trip time for the signal from the oscillator-transmitter after reflection at the target, and of the Doppler beat frequency $\Delta f$.

2. A radioaltimeter type detector according to claim 1, further including an auxiliary digital memory containing a series of values defining characteristic variation in radioaltimeter beat frequency as a function of the frequency modulation characteristic for the oscillator-transmitter contained in the digital memory.

3. A radioaltimeter type detector to claim 1, wherein the secondary digital memory is a read only memory.

4. A radioaltimeter type detector comprising:
   an oscillator-transmitter;
   a modulator suitable for imparting frequency modulation of a given characteristic to the oscillator-transmitter, said modulator including a digital memory containing a series of values defining the frequency modulation characteristic for the oscillator-transmitter;
   a mixer receiving the signal from the oscillator-transmitter and a corresponding echo signal reflected by a target;
   a controlled filter connected to the output of the mixer;
   an auxiliary digital memory containing a series of values defining characteristic variation in radioaltimeter bet frequency as a function of the frequency modulation characteristic for the oscillator-transmitter contained in the digital memory;

a secondary digital memory containing a series of values defining a speed profile for the system equipped with the detector, and thus a characteristic for change in Doppler beat frequency Δf, and a central unit controlling said controlled filter connected to the output from the mixer on the basis of information contained in the auxiliary memory and in the secondary memory 5. A radioaltimeter type detector comprising:

an oscillator-transmitter;

a modulator suitable for imparting frequency modulation of a given characteristic to the oscillator-transmitter, said modulator including a digital memory containing a series of values defining the frequency modulation characteristic for the oscillator-transmitter;

a mixer receiving the signal from the oscillator-transmitter and a corresponding echo signal reflected by a target;

wherein the oscillator-transmitter and the mixer are constituted by a varactor, a resonator connected to the output of the varactor, a first transistor stage serving as a low frequency amplifier, as a UHF amplifier, and as a mixer, said first transistor stage having its input connected to the resonator, and a second transistor stage serving as a UHF amplifier having its input connected to the output of the first transistor stage and having its output connected to the resonator; and a discriminator circuit connected to the output from the mixer and including a filter tuned substantially to the beat frequency ΔF related to the looked-for round trip time for the signal from the oscillator-transmitter after reflection at the target.

6. A radioaltimeter type detector according to claim 5, wherein the first transistor stage serves as a low frequency amplifier, as a UHF amplifier, and as a mixer, and includes a choke for separating the UHF signal form the low frequency radioaltimeter beat frequency ΔF.

7. A radioaltimeter type detector according to claim 5, wherein the digital memory defines a linear frequency modulation characteristic for the oscillator-transmitter.

8. A radioaltimeter type detector according to claim 5, wherein the digital memory defines a sinusoidal frequency modulation characteristic for the oscillator-transmitter.

9. A radioaltimeter type detector according to claim 5, wherein the digital memory defines a parabolic frequency modulation characteristic for the oscillator-transmitter.

10. A radioaltimeter type detector according to claim 5, wherein the digital memory defines a pseudo-random frequency modulation characteristic for the oscillator-transmitter.

11. A radioaltimeter type detector according to claim 5, further including:

an auxiliary digital memory containing a series of values defining characteristic variation in radioaltimeter beat frequency as a function of the frequency modulation characteristic for the oscillator-transmitter contained in the digital memory.

12. A radioaltimeter type detector according to claim 11, further including a central unit for controlling a controlled filter connected to the output of the mixer in order to tune the cut-off frequency of the controlled filter as a function of the characteristic variation in radioaltimeter beat frequency stored in the auxiliary digital memory.

13. A radioaltimeter type detector according to claim 5, further including a secondary digital memory containing a series of values defining a speed profile for the system equipped with the detector, and thus a characteristic for change in Doppler beat frequency Δf.

14. A radioaltimeter type detector according to claim 11, further including both a secondary digital memory containing a series of values defining a speed profile for the system equipped with the detector, and thus a characteristic for change in Doppler beat, frequency Δf, and a central unit controlling a controlled filter connected to the output from the mixer on the basis of information contained in the auxiliary memory and in the secondary memory.

15. A radioaltimeter type detector according to claim 5, including a comparator connected to the output from a filter, with the comparator operating on the basis of amplitude discrimination.

* * * * *